(12) United States Patent
Thazhathidathil et al.

(10) Patent No.: US 11,900,041 B2
(45) Date of Patent: Feb. 13, 2024

(54) VIA COLORING METHODS AND SYSTEMS

(71) Applicant: Arm Limited, Cambridge (GB)

(72) Inventors: Abhilash Velluridathil Thazhathidathil, Bangalore (IN); Yves Thomas Laplanche, Valbonne (FR); Ala Srinivasa Rao, Bangalore (IN)

(73) Assignee: Arm Limited, Cambridge (GB)

( * ) Notice: Subject to any disclaimer, the term of this patent is extended or adjusted under 35 U.S.C. 154(b) by 653 days.

(21) Appl. No.: 16/653,778

(22) Filed: Oct. 15, 2019

(65) Prior Publication Data
US 2021/0109999 A1 Apr. 15, 2021

(51) Int. Cl.
G06F 30/398 (2020.01)
G06F 30/30 (2020.01)
G06F 30/392 (2020.01)

(52) U.S. Cl.
CPC ............ *G06F 30/398* (2020.01); *G06F 30/30* (2020.01); *G06F 30/392* (2020.01)

(58) Field of Classification Search
CPC .. G06F 30/398; G06F 30/392; G06F 2119/18; G06F 30/394; G06F 30/39; G06F 30/18; G06F 30/3947; G06F 30/3953; G06F 2111/10; G06F 30/00; G06F 30/30; G06F 2111/04; G06F 30/20; G06F 30/3312; G06F 30/23; G06F 16/907; G06F 16/58; G06F 30/34; G03F 1/36; G03F 1/70; G03F 7/70466; G03F 7/70433; G03F 7/0035; G03F 1/00; G03F 1/26; G03F 1/30; G03F 7/70425; G03F 7/705; G03F 7/70558; G03F 1/38; G03F 1/34; G03F 1/64; G03F 7/70283; G03F 7/70441; G03F 7/70475; G03F 1/78; H01L 27/0207; H01L 21/31144; H01L 23/528; H01L 21/76895; H01L 21/027; H01L 2027/11875; H01L 21/32139; H01L 2224/29583; H01L 23/5283
USPC ...................................... 716/50–56
See application file for complete search history.

(56) References Cited

U.S. PATENT DOCUMENTS

| | | | | |
|---|---|---|---|---|
| 9,158,885 | B1 * | 10/2015 | Gray .................. | G03F 7/70433 |
| 9,262,570 | B2 * | 2/2016 | Hsu ...................... | G06F 30/392 |
| 2017/0286584 | A1 * | 10/2017 | Lefferts ................. | G06F 30/398 |
| 2017/0323046 | A1 * | 11/2017 | Hsu ........................ | G06F 30/398 |
| 2018/0144082 | A1 * | 5/2018 | Hanchinal ......... | H01L 21/76895 |
| 2019/0094709 | A1 * | 3/2019 | Chen ........................ | G03F 1/70 |
| 2019/0188353 | A1 * | 6/2019 | Correale, Jr. ........... | G06F 30/30 |

* cited by examiner

*Primary Examiner* — Binh C Tat
(74) *Attorney, Agent, or Firm* — Pramudji Law Group PLLC; Ari Pramudji

(57) ABSTRACT

In a particular implementation, a method includes: identifying prospective zones for placement of one or more vertical interconnect access pads (via) in a cell, where each of the prospective zones comprises one or more poly pitches; and assigning a first color for a particular poly pitch of a first identified zone of the identified prospective zones or assigning a first color sequence for one or more sections of the first identified zone.

20 Claims, 8 Drawing Sheets

VIA COLORING METHODS AND SYSTEMS

I. FIELD

The present disclosure is generally related to methods and systems for via coloring operations.

II. DESCRIPTION OF RELATED ART

Advances in technology have resulted in smaller and more powerful computing devices. For example, a variety of portable personal computing devices, including wireless telephones, such as mobile and smart phones, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities.

An integrated circuit ("IC") is a device (e.g., a semiconductor device) or electronic system that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect the IC's electronic and circuit components.

Design engineers design ICs by transforming logical or circuit descriptions of the ICs' components into geometric descriptions, called design layouts. Design layouts typically include (1) circuit modules (i.e., geometric representations of electronic or circuit IC components) with pins and (2) interconnect lines (i.e., geometric representations of wiring) that connect the pins of the circuit modules. In this manner, design layouts often describe the behavioral, architectural, functional, and structural attributes of the IC. To create design layouts, design engineers typically use electronic design automation ("EDA") applications. These applications provide sets of computer-based tools for creating, editing, analyzing, and verifying design layouts. The applications also render the layouts on a display device or to storage for displaying later.

Fabrication foundries ("fabs") manufacture ICs based on the design layouts using a photolithographic process. Photolithography is an optical printing and fabrication process by which patterns on a photolithographic mask (i.e., "photomask," or "mask") are imaged and defined onto a photosensitive layer coating a substrate. To fabricate an IC, photomasks are created using the IC design layout as a template. The photomasks contain the various geometries or shapes (i.e., features) of the IC design layout. The various geometries or shapes contained on the photomasks correspond to the various base physical IC elements that comprise functional circuit components such as transistors, interconnect wiring, vertical interconnect access (via) pads, as well as other elements that are not functional circuit elements but are used to facilitate, enhance, or track various manufacturing processes. Through sequential use of the various photomasks corresponding to a given IC in an IC fabrication process, a large number of material layers of various shapes and thicknesses with various conductive and insulating properties may be built up to form the overall IC and the circuits within the IC design layout.

As more circuit features are packed into an IC design layout (e.g., manufacturing processes at feature sizes of 22 nm and below), the resolution of the photolithographic process makes it difficult to fabricate the geometries or shapes on a single lithography mask. The difficulty stems from constraining factors in traditional photolithographic processes that limit the effectiveness of current photolithographic processes. Some such constraining factors are the lights/optics used within the photolithographic processing systems. Specifically, the lights/optics are band limited due to physical limitations (e.g., wavelength and aperture) of the photolithographic process. Therefore, the photolithographic process cannot print beyond a certain minimum width of a feature, minimum spacing between features, and other such physical manufacturing constraints.

For a particular layer of the IC fabrication process, the pitch specifies the sum of the width of a feature and the space on one side of the feature separating that feature from a neighboring feature on the same layer. The minimum pitch for a layer is the sum of the minimum feature width and the minimum spacing between features on the same layer. Depending on the photolithographic process at issue, factors such as optics and wavelengths of light or radiation restrict how small the pitch may be made before features can no longer be reliably printed to a wafer or mask. As such, the smallest size of any features that can be created on a layer of an IC is limited by the minimum pitch for the layer.

To allow enhancement of feature density of a cell layout, current advanced technologies utilize multi-patterning for photolithography. Suitably, in doing so, vias of substantially the same size, shape, and connectivity function are drawn on the same layer. Moreover, the layer would split into two or more masks at a time to take advantage of the lithography limit (i.e., the wavelength limit). Advantageously, through multi-patterning lithography, a designer may challenge the wavelength limit, and include a spacing that is half of a possible wavelength. Consequently, however, placement of vias in such a layer may introduce color loop violations.

For instance, when a layer is split into two masks (corresponding to two different colors) and are placed proximate to one another, the first and second masks may be placed legally. Nevertheless, a third mask that is a distance less than the design-rule-check (DRC) from the first and second mask of the layer would generate a color loop that would prevent legal placement of the third mask. Further, at cell boundaries where there may be a likelihood of abutting cells of unknown color information that may influence the cell layer, the prospects of incurring color loop violations may also be increased. One such scenario may include when a power rail via would interact with a cell via, and thus, leading to color loop violations. Accordingly, the capacity to predict and account for such scenarios and optimize and conserver via spacing for design layouts is an ongoing need in the art.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1:
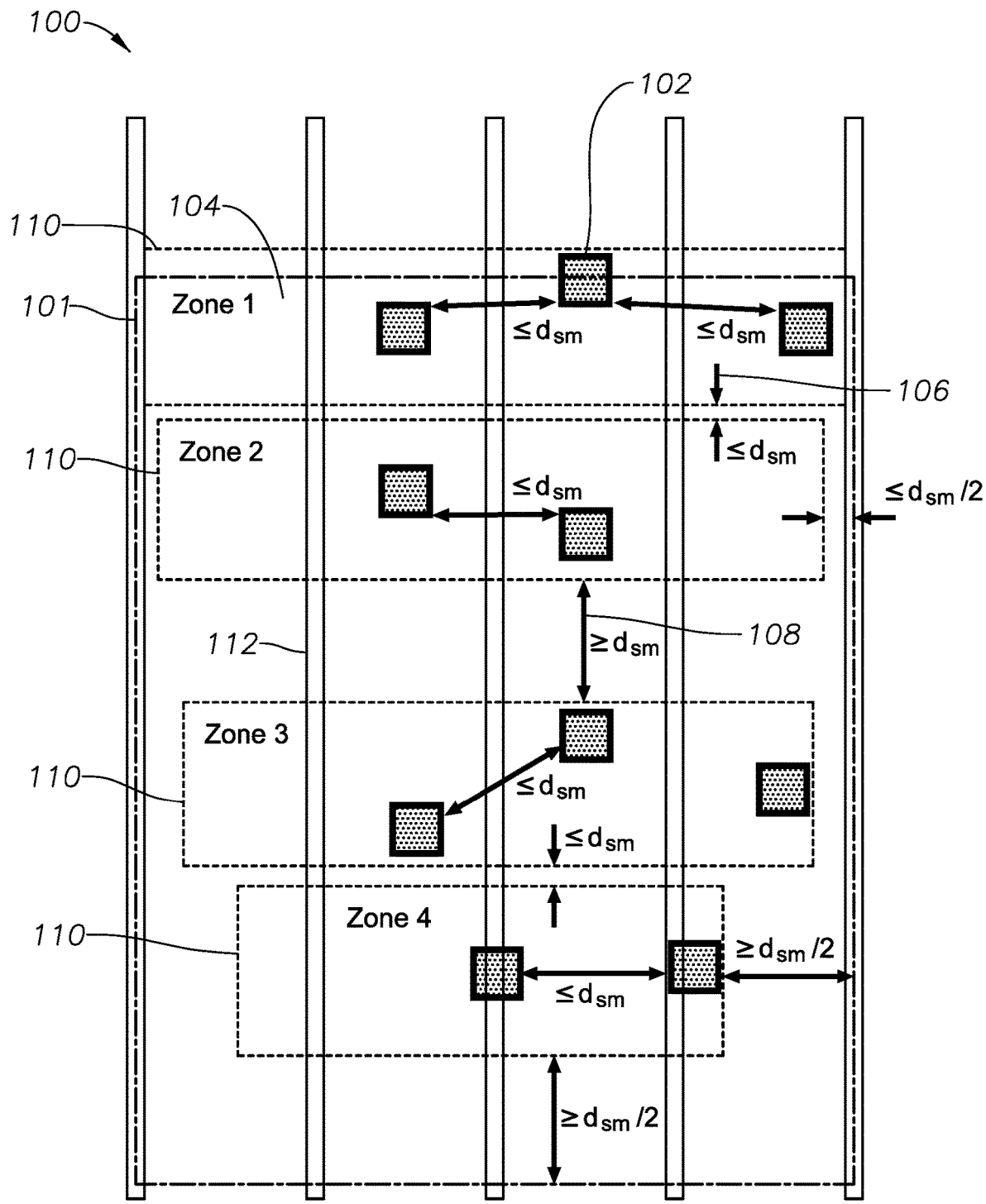
FIG. 1 is a schematic diagram of a cell layout implementable with example methods for via coloring operations.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

According to one implementation of the present disclosure, a method to resolve color loop violations is disclosed. In a particular implementation, the method includes: identifying prospective zones for placement of one or more vertical interconnect access pads (via) in a cell, where each of the prospective zones comprises one or more poly pitches; and assigning a first color for a particular poly pitch of a first identified zone of the identified prospective zones or assigning a first color sequence for one or more sections of the first identified zone.

According to another implementation of the present disclosure, a system includes a processor; and a memory accessible to the processor, the memory storing instructions that are executable by the processor to perform operations. The operations include: (1) identifying prospective zones for placement of one or more vertical interconnect access pads (via) in a cell, where each of the prospective zones comprises one or more poly pitches; (2) assigning a first color for a particular poly pitch of a first identified zone of the identified prospective zones or assigning a first color sequence for one or more sections of the first identified zone; (3) determining if a first zone-to-zone distance comprises a distance less than a same-mask distance, where the first zone-to-zone distance is a distance between the first identified zone and a second identified zone; and (4) in response to a determination that the first zone-to-zone distance comprises the distance less than the same-mask distance, assigning a second color for a corresponding poly pitch of the second identified zone with respect to the first poly pitch or assigning a second color sequence for one or more sections of the second identified prospective zone for placement, where the second color sequence is configured to shift the first color sequence of the first identified zone by one color placement.

According to another implementation of the present disclosure, a non-transitory computer-readable storage device storing instructions that, when executed by a processor, cause the processor to: identify prospective zones for placement of one or more vertical interconnect access pads (via) in a cell, where each of the prospective zones comprises one or more poly pitches; and assign a first color for a particular poly pitch of a first identified zone of the identified prospective zones or assign a first color sequence for one or more sections of the first identified zone.

Particular implementations of the present disclosure are described below with reference to the drawings. In the description, common features are designated by common reference numbers throughout the drawings.

Advantageously, systems and methods of the present disclosure provide a "correct-by-construct" approach to color loop violation occurrences. The exemplary systems and methods provide for the capacity for cell layout design via coloring that is functional, predictable, efficient (space saving), and with flexibility to determine and resolve varying coloring information and constraints within and outside of a cell layout. Thus, regardless of what coloring information may be found in abutting cells or proximate regions of prospective via placement within the cell, placement processes may be implemented within system architecture to ensure compatibility with such constraints. Hence, via coloring can be correctly assigned everywhere within a cell and abutting cells.

In certain cases, the example systems and methods may divide cells into separate via zones and shift coloring information in tandem (i.e., in sequence) with adjacent interacting zones within the same cell or in the abutting cells. In particular implementation, such color shifts would occur based on a cell pitch and same-mask design rules.

Referring to FIG. 1, an example cell layout 100 is shown with reference to an exemplary methodology of implicit via coloring used in cell layout design system (e.g., a design system 700). As depicted, the cell layout 100 illustrates an example cell boundary 101 of an example cell and includes a plurality of vertical interconnect access pads (vias) 102 (i.e., contacts) (e.g., poly contacts, diffusion contacts) that are arranged in one or more prospective zones of placement 110 (i.e., prospective zones, zones) (e.g., Zone 1 as connected to a power rail, Zone 2 as an active region, Zone 3 as another active region, and Zone 4 as a connection to a poly). Also shown in FIG. 1, one or more polys 112 (i.e., poly gates) (e.g., gate structures and resistors) may extend lengthwise across and beyond the cell layout 100 of a particular cell. As illustrated, each of the prospective zones 110 include one or more possible via positions 104 (i.e., cell-widths, poly pitches, pitches, zone portions). Moreover, in certain instances, each of the pitches 104 can be separated by a poly 112.

In certain implementations, according to multi-patterning design instructions (i.e., architectural specifications, constraints, geometric design rules), the zones 110 are regions of possible via positions where respective vias 102 of a particular zone adhere to, and are based, on certain constraints. Such constraints include, but are not limited to, vias having a common cell functionality in the cell and vias having a geographic linkage of substantially similar color distance. For instance, the common cell functionality may include one or more of a shared: diffusion connection, poly connection, power rail connection, or a similar grouping of metal tracks connections. Moreover, other exemplary design instructions include distinguishing between same-mask ($d_{sm}$) (i.e., same color distance/spacings) and different-mask distances ($d_{dm}$) (i.e., different color distance/spacings).

With reference to FIG. 1, two zones may be "color-linked" (i.e., having a color interaction) when vias in both of the zones (e.g., Zone 1, Zone 2) (or within the zones themselves in certain cases) or, in other cases, when two zones are separated by a distance (i.e., a zone-to zone distance) that is less than a same-mask distance ($d_{sm}$) (i.e., same-mask spacing) in nano-meters (nm). In contrast, two zones may be "independent" (i.e., color independent) when vias of one zone have no color link with vias in the other zone. For example, in FIG. 1, Zones 1 and 2, and Zones 3 and 4 are shown to be color-linked (e.g., as the distance between the two zones (e.g., a first zone-to-zone distance 106) is less than (or in some cases, less than or equal to) the same-mask distance ($\leq d_{sm}$)), while Zones 2 and 3 are shown to be independent (i.e., no color link) (e.g., as the distance between the Zones 2 and 3 (e.g., a second zone-to-zone distance 108) is greater than or equal to the same-mask distance ($\geq d_{sm}$)). Hence, in such an example, vias 102 in Zone 1 would influence and be influenced by the coloring of vias 102 in Zone 2, while vias 102 in Zone 3 would influence and be influenced by the coloring of vias 102 in Zone 4. However, vias 102 in Zone 2 would not influence or be influenced by the coloring of vias 102 in Zone 3.

In one example, as shown in FIG. 1, vias 102 in the horizontal direction (e.g., in the same zone) are shown as being separated by a distance that is less than (or in some cases, less than or equal to) a same-mask distance ($\leq d_{sm}$) (i.e., same-mask spacing) in nano-meters (nm); thus, representing a color interaction between the respective pitches 104. However, in other examples, vias 102 in the horizontal direction, for instance, can be separated by a distance that is greater than (or in some cases, greater than or equal to) the same-mask distance ($\geq d_{sm}$) and a color interaction may still occur (that can potentially give rise to a color loop violation). In such other examples, it may be possible to have color interactions between respective pitches 104 from vias 102 in other zones (e.g., when the distance between the vias 102 is less than (or in some cases, less than or equal to) a same-mask distance ($\leq d_{sm}$)).

Moreover, when two cells abut (e.g., are adjacent to one another), some zones may interact, while other zones may be independent of one another. For instance, in FIG. 1, Zone 1 is color-linked between the example cell and another abutting cell in the north/south (N/S) (e.g., vertical) and the east/west (E/W) (e.g., horizontal) directions (e.g., as Zone 1 extends over the cell boundary 101 and includes a distance to the edge of the cell layout 100 that is less than (or in some cases, less than or equal to) the same-mask distance ($\leq d_{sm}$) (e.g., in this case, $\leq d_{sm}/2$). Accordingly, in the example, the abutment of adjacent cells on the N/S or E/W edges of the example cell boundary 100 would impact the coloring and be impacted by the coloring of vias 102 in Zone 1.

As another example, Zones 2 and 3 of the example cell are shown to each be separately linked to other abutting cells in the east/west (E/W) directions (e.g., as both Zones 2 and 3 include a distance to the edge of the cell layout 100 that is less than (or in some cases, less than or equal to) the same-mask distance ($\leq d_{sm}$) (i.e., same color distance) (e.g., in this case, $\leq d_{sm}/2$). Moreover, Zone 4 of the example cell is shown to not be linked with other abutting cells in either the north/south (N/S) and the east/west (E/W) directions (e.g., as Zone 4 includes a distance to the N/S and E/W edges of the cell layout 100 that is greater than (or in some cases, greater than or equal to) the same-mask distance ($\geq d_{sm}$) (e.g., in this case, $\geq d_{sm}/2$). Hence, in the example, any abutment of adjacent cells on the N, S, E, W edges of the example cell boundary 100 would not impact the coloring of vias 102 in Zone 4. Advantageously, based on such geometric design rules, a circuit designer guided through an exemplary system (e.g., system 700 as described herein) may determine which zones of the example cell are interacting and influencing (and being influenced by) other zones and other cells, and which zones are not interacting and influencing other zones and other cells.

Figure 2:
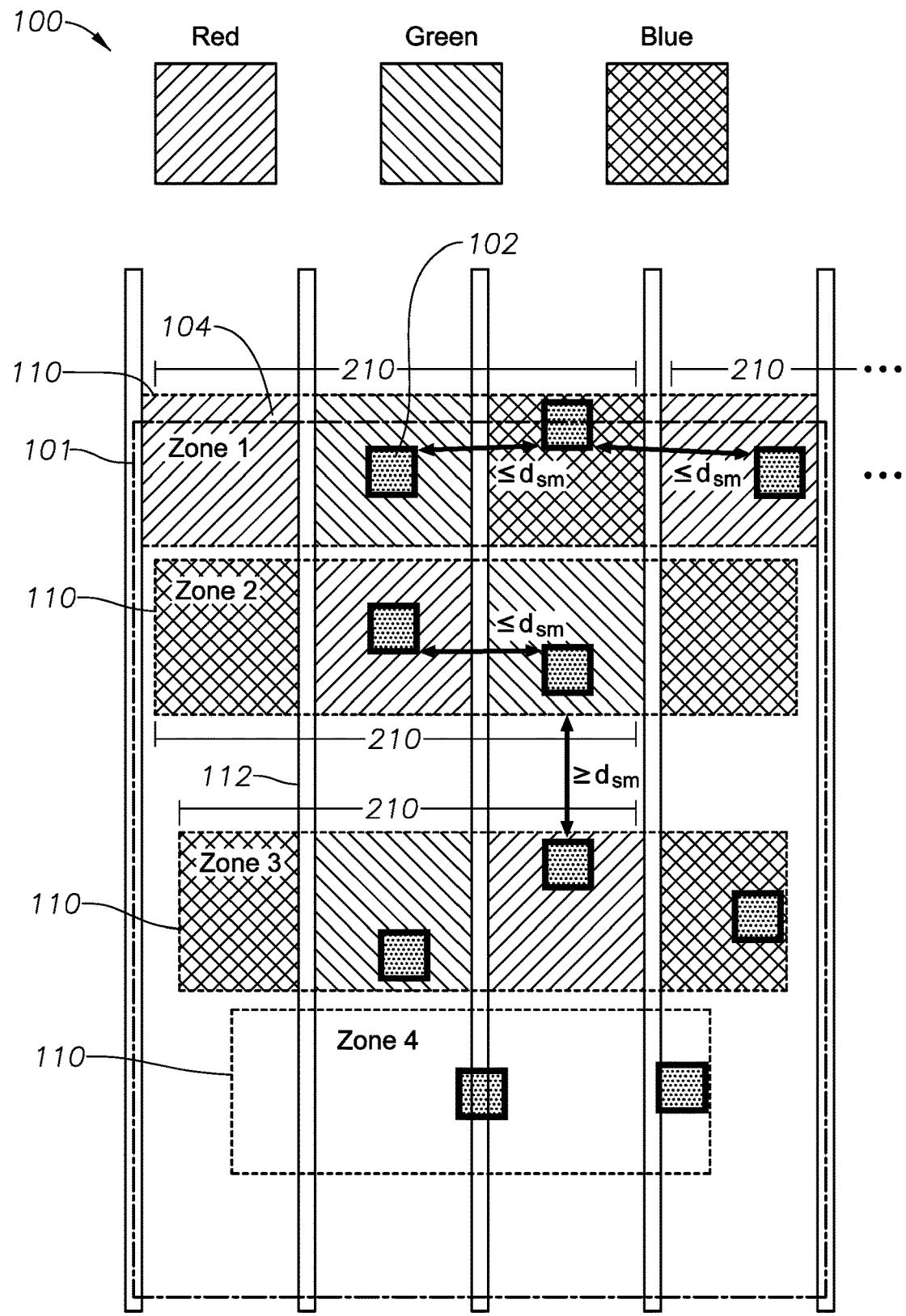
FIG. 2 is a schematic diagram of a cell layout implementable with example methods for via coloring operations.
Figure 3:
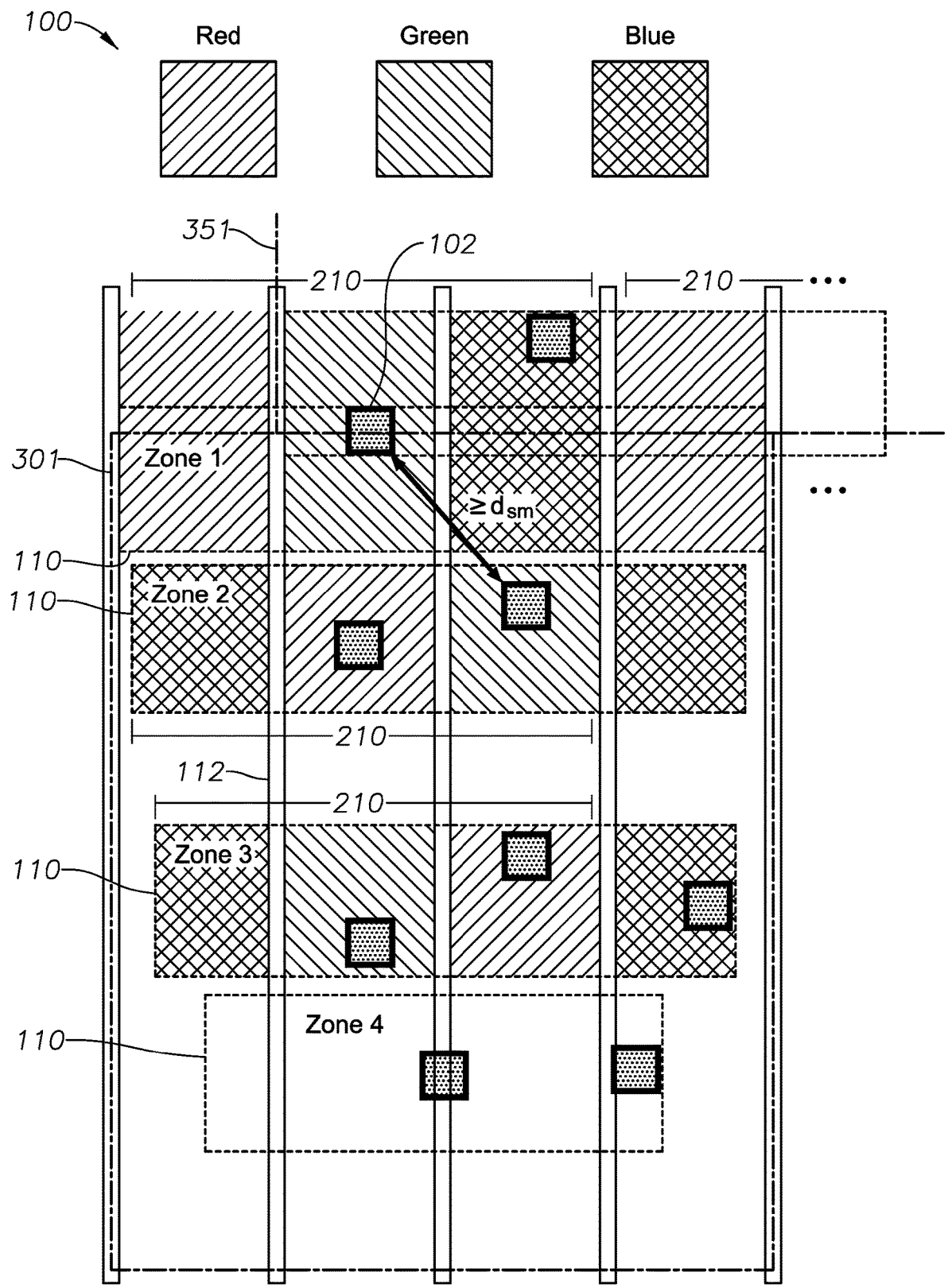
FIG. 3 is a schematic diagram of a cell layout implementable with example methods for via coloring operations.
Figure 4:
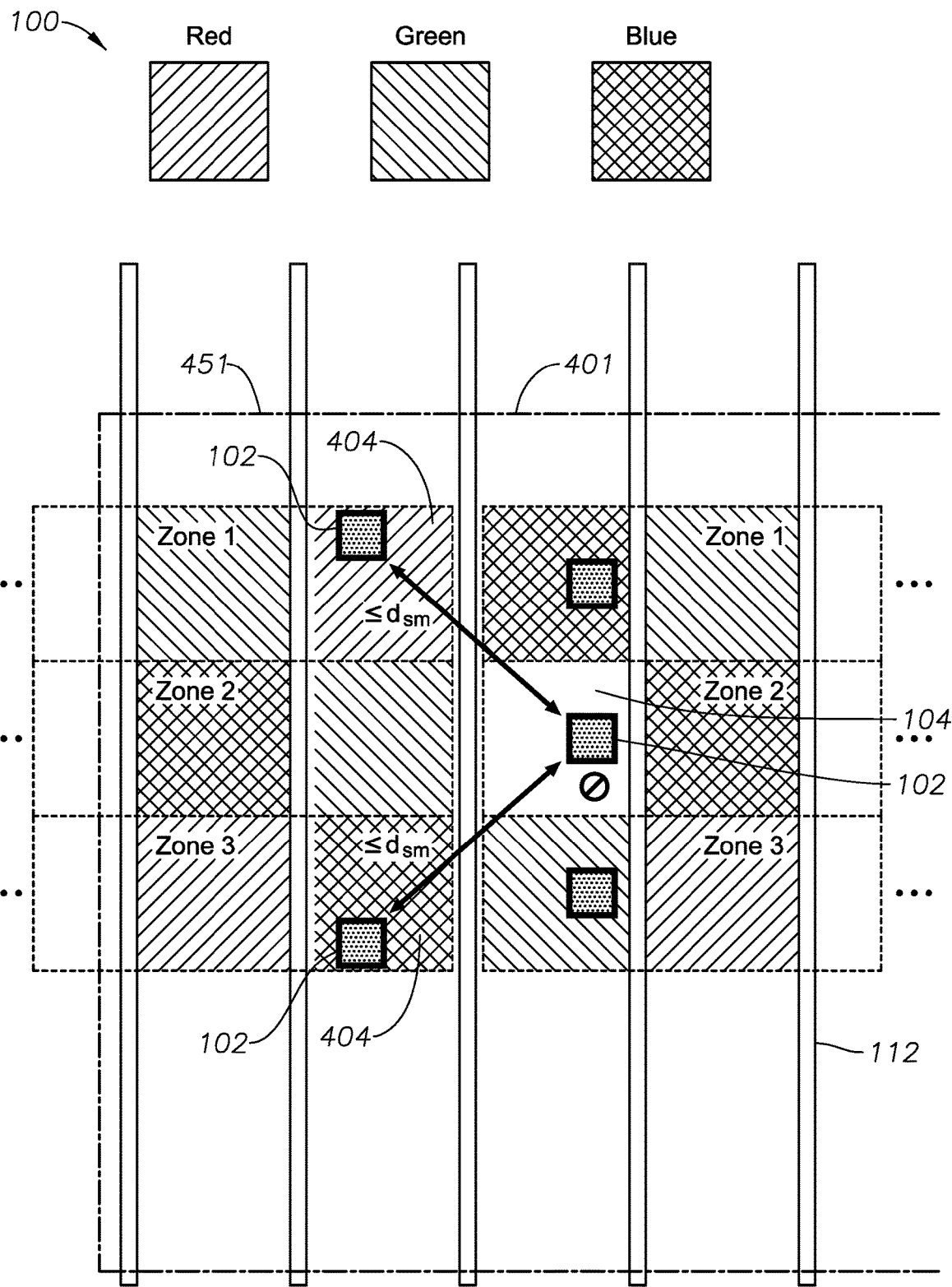
FIG. 4 is a schematic diagram of a cell layout implementable with example methods for via coloring operations.

Referring to FIGS. 2-4, the example cell of FIG. 1 (and abutting cells 351 and 451 in FIGS. 3 and 4) is/are shown with reference to an exemplary methodology and systems of implicit via coloring used in a cell layout design. As illustrated in FIG. 2, using the cell layout 100 of FIG. 1, the process may be described. For instance, as the example Zone 1 (e.g., the prospective zone 110) is interacting with the cell boundary 101, any cell abutment would have an impact on the color placement of Zone 1. Moreover, the prospective zones 110 for placement also may be dividend based on the horizontal pitch (i.e., poly pitch, cell placement pitch). In certain implementations, the distance between the poly gates 112 of a particular zone would define one possible via position 104 (i.e., zone portion, horizontal pitch, poly pitch) for color assignment. As shown in the example of FIGS. 2-5, a possible three-color sequence (e.g., red, green, blue) (i.e., coloring scheme, a coloring pattern order) may be assigned per section 210 of each zone (e.g., each identified zone 110 for placement). The three-color sequence denotes a triple-patterning layer. In certain cases, the three-color sequence would continue with the same sequence in adjacent sections. Upon the coloring of Zone 1, the procedure may follow to the next zone that "interacts" (i.e., is color-linked) with Zone 1. In this example, the implicit coloring of Zone 2 may be determined. As Zone 2 has been established to interact with Zone 1, the assigned color-sequence is shifted by one poly pitch (i.e., one color placement). For example, if the color scheme for Zone 1 is: red, green, blue in order, then the color scheme for Zone 2 would be: blue, red, green in consecutive order. Next, in the following step, in assessing the next zone for color scheme, Zone 3 would have been determined to not interact with Zone 2. Correspondingly, Zone 3 can have a completely independent from, and have no relation to, the color scheme of Zone 2. Thus, Zone 3 can be assigned any sequence of the three colors: red, green, and blue. Advantageously, in this manner, the "flipping" (i.e., shifting, changing, assigning of different colors) of colors allows for significant design flexibility for cell abutment in design layouts.

As illustrated in FIG. 3, a top cell 351 (e.g., an abutting cell) is shown to overlap the bottom cell 301 (e.g., the example cell in FIG. 1 incorporated within the cell boundary 101) at the N/S edge. Due to cell abutment, the positioning of vias near the N/S edge proximate to the cell boundary 101 would be based on the potential structures within both the top and bottom cells 301, 351. Accordingly, at the abutting edge, because there is a shared (or overlapping) boundary, the abutting cells would assume substantially identical zones. Hence, in this instance, Zone 1 would be extended between both the example cell 301 and the abutting cell 351. For example, if Zone 1 is the power rail, the power rail would be shared by both cells 301, 351 on the top and the bottom. Suitably, Zone 1 would merge at the cell boundary and extend to both cells and have identical coloring.

As illustrated in FIG. 4, an adjacent cell 451 (e.g., an abutting cell) is shown to abut the example cell 401 (i.e., the example cell of FIG. 1) at the E/W edge (horizontal edge). Due to the cell abutment, similar to as described with reference to FIG. 3, color assignment can be performed. However, based on design-rule-check (DRC) spacing rules, if the distance between the example zones (or distances between vias of the respective zones in certain instances) are less than the same-mask defined distance, the cell layouts would incur a color loop violation, and subsequently, fail the DRC. Accordingly, the color sequences corresponding to the zones 110 for possible placement would need to be shifted to correct (legalize) placement. Nevertheless, in certain cases, it may not be feasible to do so and still legalize placement. For example, with reference to FIG. 4, the distance from a via 102 placement in a possible pitch 104 (e.g., having a red assigned color) in Zone 2 of the example cell 401 is less than the same mask difference to both via 102 placements in possible pitches 404 of both Zones 1 and 3 of the adjacent cell 451 that have different assigned colors (e.g., red and blue, respectively). Hence, Zone 2 of the example cell 401 cannot both be red and blue at the same time. Consequently, this scenario would fail the DRC. To resolve the issue, in one solution, either Zone 1 or 3, but not both, can be constructed to include a via 102 at the cell boundaries of the cells 401 and 451. In some instances, only certain limited pitches may have viable via positions at cell boundaries.

In another exemplary solution, an edge-type procedure (i.e., edge-type design rule) to restrict cell placement (and in some instances, to restrict pitch or via placement) may be generated, defined, and set as an architectural specification for the cell. For example, an edge-type design rule can be defined such that: when a color-loop violation occurs due to a diagonal spacing not satisfying the DRC rule, a condition or restriction can be set for a place-and-route set up tool (as integrated as part of the cell layout design system 700) that for certain defined or relevant edges, such edges cannot abut with certain predetermined pitches. In certain implementations, the place-and-route set up tool (i.e., PnR tool) may evaluate a particular edge-type and determine a cell layout variant based on the edge-type. In such implementations, the place and route tool may identify a particular edge-type of a cell (e.g., as defined in abstract views (eg:lef) or supplied directly as in input to PnR tool based on a cell name) and restrict the placement/abutment of cells with certain edge-types. For instance, an edge-type design rule set may be provided as an input to the PnR tool, where the design rule would indicate which type of cells the edge-type can or cannot abut. The edge-type design rule may also indicate the spacing or "keep-out" that may be followed in instances where cells with prohibited edge-types are abutting. Hence, advantageously, by restricting such placement restriction of cells, such an edge-type design rule may be used to pre-emptively prevent via color violations. Furthermore, the abutment rules itself may also be correspondingly defined based on the edge-types. In certain instances, the edge-type can be utilized to ensure that all zones may contain vias 102. Advantageously, edge-types would not be limited to just E/W edges (e.g., horizontal edges) but can be also utilized for N/S edges (e.g., vertical edges) as well. Thus, in instances where color violations cannot be resolved, an edge-type may be implemented to restrict cell placement and clear such color violations. In doing so, place and route tools may read and place vias 102 according to a predefined legal placement. Also, in certain implementations, final via patterns for corresponding cell layouts would not contain the coloring information that may be assigned during cell layout design. Accordingly, the above-described coloring assignments can be implicitly assigned during the cell layout design stage.

Figure 5:
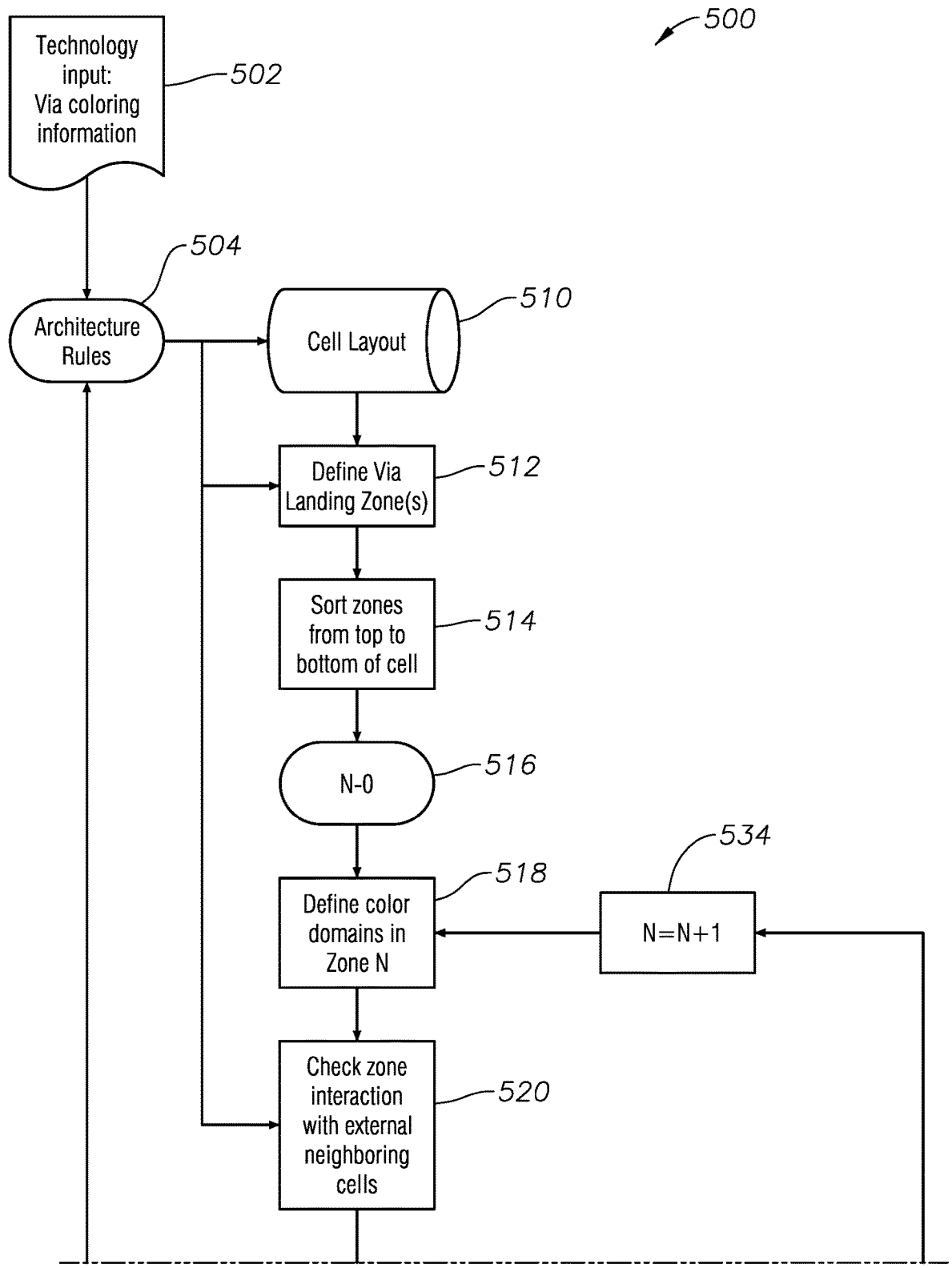
FIG. 5 is a flowchart of a particular illustrative aspect of methods for via coloring operations.
Figure 5:
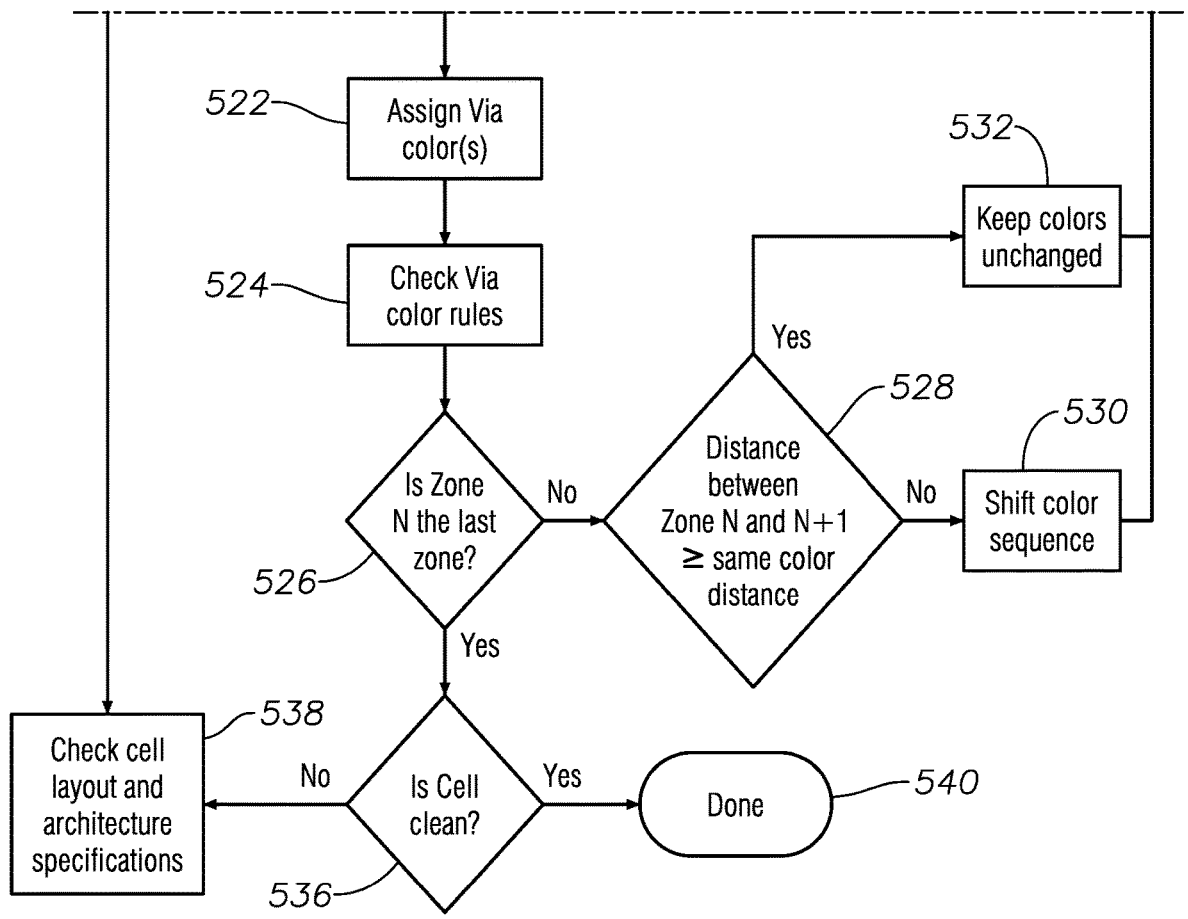
Figure 7:
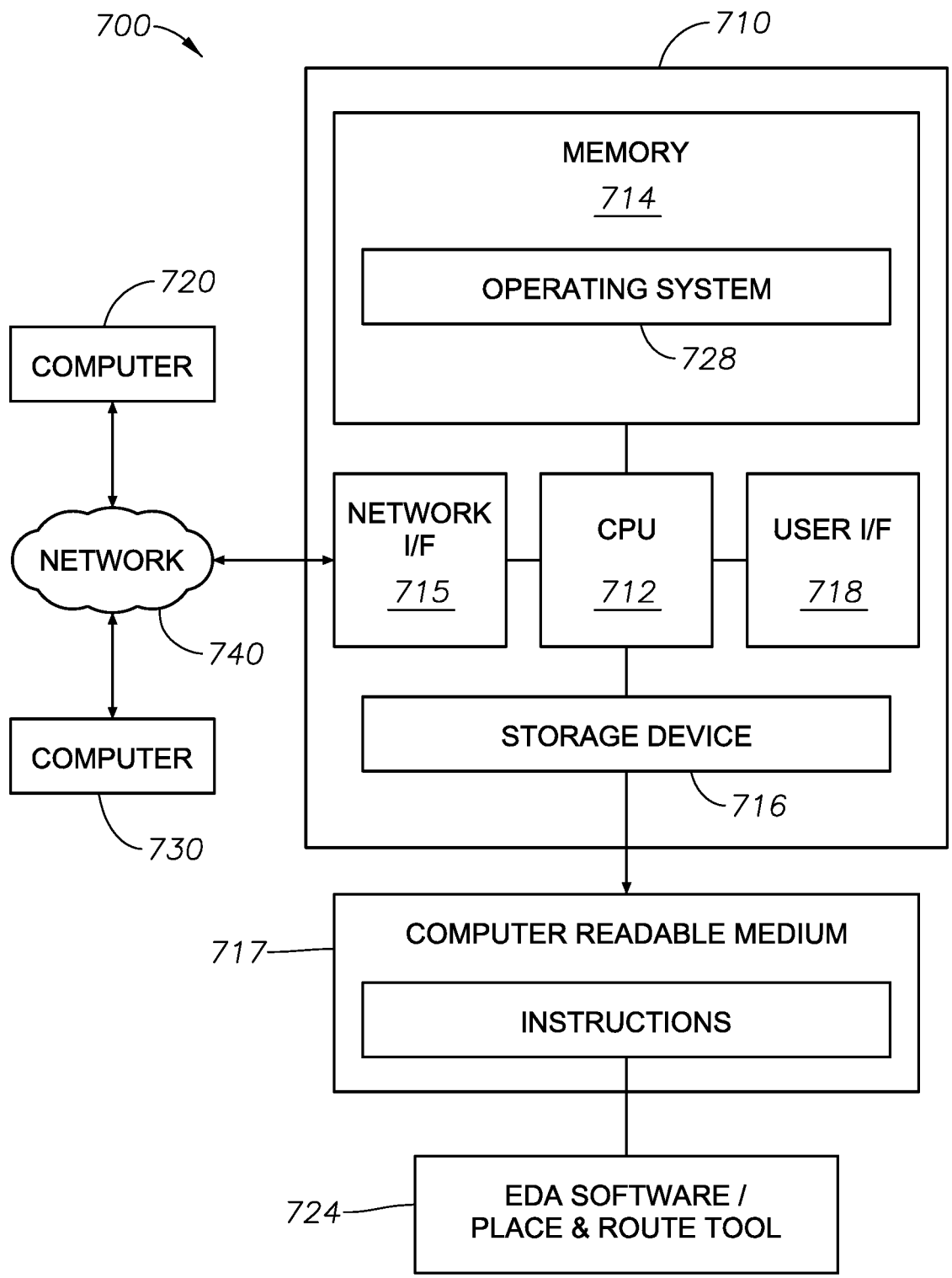
FIG. 7 is a block diagram of a computer system in accordance with implementations of various techniques described herein.

Referring to FIG. 5, one example flow diagram 500 applicable for the above-described example procedure of an example cell layout 100 in FIGS. 1-4 and used with reference to a cell layout design system 700 in FIG. 7 is shown. Implemented (and programmed) in the example system 700 are proposed via coloring information 502 and architectural specification rules 504. At step 512, based on the architectural rules and the layout, via landing zones (i.e., prospective zones for via placement) can be defined. In doing so, "influence" zones may be triangulated. At step 514, the cell layout may be sorted (i.e., separated) into prospective zones from top to bottom of a particular cell. At step 516, an example Zone N is denoted as the zone under consideration. At step 518, a color domain can be defined (e.g., a single-color placement, a color sequence placement). At step 520, zone interactions (of respective pitches) with cell boundaries and external neighboring cells may be checked. At step 522, based on the zone-to-zone interactions, the example Zone N is assigned one or more via colors. At step 524, via coloring may be checked through DRC for any color violations. At step 526, a determination may be made whether the example Zone N is the last zone. At step 528, if the example Zone N is not the last zone, a determination is made whether the distance between Zone N and the next zone, Zone N+1 is greater than or equal to the same color distance. At step 530, if the zone-to-zone distance between Zone N and Zone N+1 is not greater than or equal to the same color distance, the assigned color sequence for Zone N+1 may be shifted by one color placement (i.e., one pitch). At step 532, if the zone-to-zone distance between Zone N and Zone N+1 is greater than or equal to the same color distance, the color sequence for Zone N+1 may remain unchanged (e.g., color independent). At step 534, the system 700 would proceed back to step 518 having defined the zone under consideration (Zone N) as equal to the next incremental zone (e Zone N+1). In this manner, successive zones may be considered for potential violations and color assignments. At step 536, when Zone N is in fact the last zone (i.e., yes to the determination at step 526), a determination is made whether the cell layout is clean (e.g., whether the cell layout aligns with the cell layout architectural specification). At step 538, if it is determined that cell layout is not clean, the architectural specification may be checked and corrected based on the architectural rules 504. At step 540, if it is determined that cell layout is in fact clean, the design system 700 procedure is complete.

Figure 6:
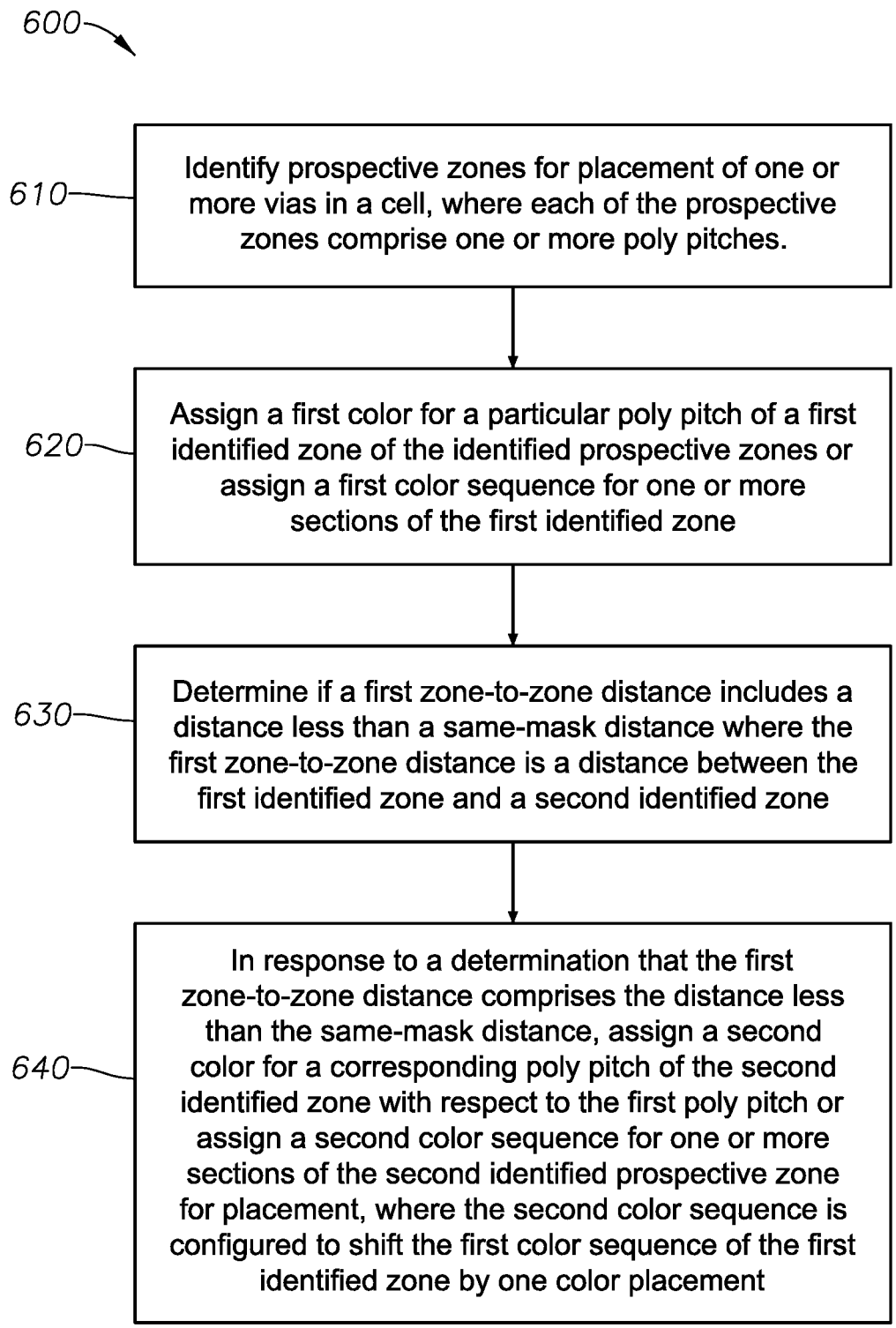
FIG. 6 is a flowchart implementable with example methods for via coloring operations.

Referring to FIG. 6, an example method 600 (i.e., method 600) applicable for the flow diagram 500 in FIG. 5 is shown. The method 600 may be used as a basis for multi-patterning design rules for via placement and to resolve design-rule violations in a circuit design layout.

At block 620, a first color for a particular poly pitch of a first identified zone of the identified prospective zones may be assigned or a first color sequence for one or more sections of the first identified zone may be assigned. For example, with reference to FIGS. 1-4, a first color (e.g., red) for a particular poly pitch 104 of a first identified zone (e.g., Zone 1) of the identified prospective zones may be assigned or a first color sequence (e.g., red, green, blue) for one or more sections of the first identified zone (e.g., Zone 1) may be assigned. As another example, with reference to steps 518 and 522 of FIG. 5, color domains may be defined and via coloring may be assigned.

At block 620, a first color for a particular poly pitch of a first identified zone of the identified prospective zones may be assigned or a first color sequence for one or more sections of the first identified zone may be assigned. For example, with reference to FIGS. 1-4, a first color (e.g., red) for a particular poly pitch 104 of a first identified zone (e.g., Zone 1) of the identified prospective zones may be assigned or a first color sequence (e.g., red, green, blue) for one or more sections of the first identified zone (e.g., Zone 10 may be assigned. As another example, with reference to steps 518 and 522 of FIG. 5, color domains may be defined and via coloring may be assigned.

At block 630, it may be determined whether a first zone-to-zone distance includes a distance less than a same-mask distance. Also, the first zone-to-zone distance is a distance between the first identified zone and a second identified zone. For example, with reference to FIGS. 1-4, it may be determined whether the distance between Zone 1 and Zone 2 (e.g., a first zone-to-zone distance 106) corresponds to a distance less than a same-mask distance ($\leq d_{sm}$) (i.e., same color distance). Also, as another example, with reference to step 528 in FIG. 5, it may be determined whether the distance between Zone N and Zone N+1 is greater than or equal to same-mask distance (i.e., same color distance).

At block 640, in response to a determination that the first zone-to-zone distance includes a distance less than the same-mask distance, a second color may be assigned for a corresponding poly pitch of the second identified zone with respect to the first poly pitch or a second color sequence may be assigned for one or more sections of the second identified prospective zone for placement, where the second color sequence is configured to shift the first color sequence of the first identified zone by one color placement. For example, with reference to FIGS. 1-4, in response to a determination that the first zone-to-zone distance 106 comprises a distance less than the same-mask distance ($\leq d_{sm}$) (i.e., same color distance), a second color (e.g., blue) may be assigned for a corresponding poly pitch (i.e., a particular via position, a particular pitch, a particular zone portion) of the second identified zone with respect to the first poly pitch or a second color sequence (i.e., a color scheme, a specific pattern order of colors, e.g., three-color scheme) (e.g., red, green, blue in order) may be assigned for one or more sections 210 of the second identified prospective zone (e.g., Zone 2) for placement, where the second color sequence (e.g., blue, red, green, in order) is configured to shift the first color sequence (e.g., red, green, blue, in order) of the first identified zone (e.g., Zone 1) by one color placement (i.e., by one pitch). Also, as another example, with reference to step 530 in FIG. 5, once it is determined that the distance between Zone N and Zone N+1 is not greater than or equal to same-mask distance, then the assigned color sequence of Zone N+1 may be shifted by one color placement.

In certain implementations, the example method 600 may include additional blocks. For instance, at block 650 (not shown), in response to a determination that the first zone-to-zone distance includes a distance greater than or substantially equal to the same-mask distance, assigning any color for the corresponding poly pitch of the second identified prospective zone or assigning any color sequence for one or more sections of the second identified prospective zone for placement. For example, with reference to FIGS. 1-4, in response to a determination that the first zone-to-zone distance 106 comprises a distance greater than or substantially equal to the same-mask distance ($\geq d_{sm}$), any color for the corresponding poly pitch of the second identified prospective zone (e.g., Zone 2) may be assigned or any color sequence may be assigned for one or more sections 210 of the second identified prospective zone (e.g., Zone 2) for placement. As another example, with reference to step 532 in FIG. 5, once it is determined that the distance between Zone N and Zone N+1 is in fact greater than or equal to same-mask distance (i.e., same color distance), then the assigned color sequence of Zone N+1 may remain unchanged.

Furthermore, at block 660 (not shown), it may be determined whether the corresponding poly pitch of the second identified zone is design-rule-check (DRC) legal with respect to the particular poly pitch of the first identified zone; or it may be determined whether the first identified zone for placement is DRC legal with respect to the second identified zone for placement. For example, with reference to FIGS. 1-4, it may be determined whether the corresponding poly pitch of the second identified zone (e.g., Zone 2) is design-rule-check (DRC) legal with respect to the particular poly pitch of the first identified zone (e.g., Zone 1); or it may be determined whether the first identified zone for placement is DRC legal with respect to the second identified zone (e.g., Zone 2) for placement. As another example, with reference to step 524 in FIG. 5, the assigned via coloring may be checked through DRC for color violations.

FIG. 7 illustrates example hardware components in the computer system 700 that may be used to determine and resolve color loop (i.e., odd loop) violations in design layouts. In FIG. 7, in certain implementations, the example computer system 700 (e.g., networked computer system and/or server) may include place and route tools (i.e., electronic design automation (EDA) software tool 724) and execute software based on the procedure as described with reference to the flowchart 500 in FIG. 5 and the method 600.

The EDA software tool 724 may provide computer-aided physical layout designs for metal and via layers of the IC. The procedure 500 and method 600 may be stored as program code as instructions 717 in the computer readable medium of the storage device 716 (or alternatively, in memory 714) that may be executed by the computer 710, or networked computers 720, 730, other networked electronic devices (not shown) or a combination thereof. In certain implementations, each of the computers 710, 720, 730 may be any type of computer, computer system, or other programmable electronic device. Further, each of the computers 710, 720, 730 may be implemented using one or more networked computers, e.g., in a cluster or other distributed computing system.

In certain implementations, the system 700 may be used with semiconductor integrated circuit (IC) designs that contain all standard cells, all blocks or a mixture of standard cells and blocks. In a particular example implementation, the system 700 may include in its database structures: a collection of cell libraries, one or more technology files, a plurality of cell library format files, a set of top design format files, one or more Open Artwork System Interchange Standard (OASIS/OASIS.MASK) files, and/or at least one EDIF file. The database of the system 700 may be stored in one or more of memory 714 or storage devices 716 of computer 710 or in networked computers 720, 720.

The system 700 may perform the following functions automatically, with variable user input: Boor-planning, including generation of cell regions sufficient to place all standard cells; standard cell placement; power and ground net routing; global routing; detail routing and pad routing. In some instances, such functions may be performed substantially via user input control. Additionally, such functions can be used in conjunction with the manual capabilities of the system 700 to produce the target results that are required by a designer. In certain implementations, the system 700 may also provide for the capability to manually perform functions such as: cell region creation, block placement, pad and cell placement (before and after automatic placement), net routing before and after automatic routing and layout editing. Moreover, verification functions included in the system 700 may be used to determine the integrity of a design after, for example, manual editing, design rule checking (DRC) and layout versus schematic comparison (LVS).

In one implementation, the computer 700 includes a central processing unit (CPU) 1612 having at least one hardware-based processor coupled to a memory 714. The memory 714 may represent random access memory (RAM) devices of main storage of the computer 710, supplemental levels of memory (e.g., cache memories, non-volatile or backup memories (e.g., programmable or flash memories)), read-only memories, or combinations thereof. In addition to the memory 714, the computer system 700 may include other memory located elsewhere in the computer 710, such as cache memory in the CPU 712, as well as any storage capacity used as a virtual memory (e.g., as stored on a storage device 716 or on another computer coupled to the computer 710).

The computer 710 may further be configured to communicate information externally. To interface with a user or operator (e.g., a circuit design engineer), the computer 710 may include a user interface (I/F) 718 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 710 may include a network interface (I/F) 715 which may be coupled to one or more networks 740 (e.g., a wireless network) to enable communication of information with other computers and electronic devices. The computer 710 may include analog and/or digital interfaces between the CPU 712 and each of the components 714, 715, 716, and 718. Further, other non-limiting hardware environments may be used within the context of example implementations.

The computer 710 may operate under the control of an operating system 726 and may execute or otherwise rely upon various computer software applications, components, programs, objects, modules, data structures, etc. (such as the programs associated with the procedure 500 and the method 600 and related software). The operating system 728 may be stored in the memory 714. Operating systems include, but are not limited to, UNIX® (a registered trademark of The Open Group), Linux® (a registered trademark of Linus Torvalds), Windows® (a registered trademark of Microsoft Corporation, Redmond, WA, United States), AIX® (a registered trademark of International Business Machines (IBM) Corp., Armonk, NY, United States) i5/O® (a registered trademark of IBM Corp.), and others as will occur to those of skill in the art. The operating system 726 in the example of FIG. 7 is shown in the memory 714, but components of the aforementioned software may also, or in addition, be stored at non-volatile memory (e.g., on storage device 716 (data storage) and/or the non-volatile memory (not shown). Moreover, various applications, components, programs, objects, modules, etc. may also execute on one or more processors in another computer coupled to the computer 710 via the network 740 (e.g., in a distributed or client-server computing environment) where the processing to implement the functions of a computer program may be allocated to multiple computers 720, 730 over the network 740.

In example implementations, certain cell layout diagrams have been provided in FIGS. 1-7, whose redundant description has not been duplicated in the related description of analogous cell layout diagrams. It is expressly incorporated that the same cell layout diagrams with identical symbols and/or reference numerals are included in each of embodiments based on its corresponding figure(s).

Although one or more of FIGS. 1-7 may illustrate systems, apparatuses, or methods according to the teachings of the disclosure, the disclosure is not limited to these illustrated systems, apparatuses, or methods. One or more functions or components of any of FIGS. 1-7 as illustrated or described herein may be combined with one or more other portions of another of FIGS. 1-7. Accordingly, no single implementation described herein should be construed as limiting and implementations of the disclosure may be suitably combined without departing form the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 714, the storage device 716, or both, may include tangible, non-transitory computer-readable media or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below. Different examples of the device(s) and method(s) disclosed herein include a variety of components, features, and functionalities. It should be understood that the various examples of the device(s) and method(s) disclosed herein may include any of the components, features, and functionalities of any of the other examples of the device(s) and method(s) disclosed herein in any combination, and all of such possibilities are intended to be within the scope of the present disclosure. Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A method comprising:
   identifying prospective zones for placement of one or more vertical interconnect access pads (via) in a cell, wherein each of the prospective zones comprises one or more poly pitches, and wherein each of the prospective zones corresponds to different regions of via connectivity including a power rail connection region, an active connection region, and a poly connection region; and
   assigning different colors to each identified prospective zone by assigning a different color to each of the prospective zones that correspond to different regions of via connectivity including a first color to the power rail connection region, a second color to the active connection region, and a third color to the poly connection region.

2. The method of claim 1, wherein each of the prospective zones for via placement in the cell are identified based on prospective zones for via placement in an abutting cell when a zone-to-zone distance between the cells is less than the same mask distance.

3. The method of claim 1, further comprising:
   determining if prospective zones for via placement of an abutting cell is arranged for color interaction with the identified prospective zones in cell; and
   in response to the determination of the color interaction, assigning the different colors for corresponding one or more poly pitches of the abutting cell with respect to one or more poly pitches of the cell.

4. The method of claim 3, further comprising:
   determining if the corresponding one or more poly pitches of the abutting cell is design-rule-check (DRC) legal with respect to the one or more poly pitches of the poly pitches of the first cell.

5. The method of claim 4, further comprising:
   in response to an DRC illegality of the one or more poly pitches of the cell and the abutting cell, restricting via placement in conflict zones or providing an edge-type design rule in the architectural specification for the cell.

6. The method of claim 1, further comprising:
   providing an edge-type design rule in the architectural specification for the cell to arrange cell placement.

7. The method of claim 6, further comprising:
   evaluating, by a place-and-route set up tool, the edge-type; and
   determining a cell layout variant based on the edge-type.

8. The method of claim 1, wherein identifying the prospective zones for placement comprises:
   computing respective influence-regions of the cell; and
   separating the cell into the different prospective zones for via placement based on the respective influence-regions.

9. The method of claim 8, wherein influence-regions are computed based on same-mask distances to a particular zone of via placement or same-mask distances to cell boundaries.

10. The method of claim 1, wherein a particular poly pitch comprises a cell-width distance between two proximate polys, and wherein the particular poly pitch comprises one or more possible via positions.

11. A method comprising:
    identifying prospective zones for placement of one or more vertical interconnect access pads (via) in a cell, wherein each of the prospective zones comprises one or more poly pitches;
    assigning a first color for a particular poly pitch of a first identified zone of the identified prospective zones or assigning a first color sequence for one or more sections of the first identified zone based on the first identified zone having a color interaction with a second identified zone;
    determining if a first zone-to-zone distance comprises the color interaction, wherein the color interaction corresponds to a distance less than a same-mask distance, wherein the first zone-to-zone distance is a distance between the first identified zone and the second identified zone; and
    in response to a determination of the color interaction, assigning a second color for a corresponding poly pitch of the second identified zone with respect to the first poly pitch or assigning a second color sequence for one or more sections of the second identified prospective zone for placement, wherein the second color sequence is configured to shift the first color sequence of the first identified zone by one color placement.

12. The method of claim 11, further comprising:
    in response to a determination that the first zone-to-zone distance comprises a distance greater than or substantially equal to the same-mask distance, assigning any color for the corresponding poly pitch of the second identified prospective zone or assigning any color sequence for one or more sections of the second identified prospective zone for placement.

13. The method of claim 12, further comprising:
    determining if the corresponding poly pitch of the second identified zone is design-rule-check (DRC) legal with respect to the particular poly pitch of the first identified zone; or
    determining if the first identified zone for placement is DRC legal with respect to the second identified zone for placement.

14. The method of claim 12, further comprising:
    determining if a second zone-to-zone distance comprises a distance less than a same-mask distance, wherein the second zone-to-zone distance is a distance between the second identified zone and a third identified zone; and
    in response to a determination that the second zone-to-zone distance comprises the distance less than the same-mask distance, assigning the first color or a third color for a corresponding poly pitch of the third identified zone with respect to the corresponding poly pitch identified zone or assigning a third color sequence for one or more sections of the third identified prospective zone for placement, wherein the third color sequence is configured to shift the second color sequence by one color placement.

15. The method of claim 14, further comprising:
    in response to a determination that the second zone-to-zone distance comprises a distance greater than or substantially equal to the same-mask distance, assigning any color for the corresponding poly pitch of the third identified prospective zone or assigning any color sequence for one or more sections of the third identified prospective zone for placement.

16. The method of claim 15, further comprising:
    determining if the corresponding poly pitch of the third identified zone is design-rule-check (DRC) legal with respect to the corresponding poly pitch of the second identified zone; or
    determining if the second identified zone for placement is DRC legal with respect to the third identified zone for placement.

17. A method comprising:
- identifying prospective zones for placement of one or more vertical interconnect access pads (via) in a cell, wherein each of the prospective zones comprises one or more poly pitches; and
- assigning a first color for a particular poly pitch of a first identified zone of the identified prospective zones or assigning a first color sequence for one or more sections of the first identified zone based on the first identified zone having a color interaction with a second identified zone,
- wherein each of the prospective zones for via placement are identified based on a common cell functionality including one or more of a diffusion connection region, a poly connection region, a power rail connection region, or a grouping of metal track connection regions.

18. The method of claim 17, wherein each of the prospective zones for via placement are identified based on geographic linkage of substantially similar color distance.

19. A system comprising:
- a processor; and
- a memory accessible to the processor, the memory storing instructions that are executable by the processor to perform operations comprising:
  - identifying prospective zones for via placement in a cell, wherein each of the prospective zones correspond to different regions of via connectivity including a power rail connection region, an active connection region, and a poly connection region;
  - assigning different colors to each identified prospective zone by assigning a different color to each of the prospective zones that correspond to the different regions of via connectivity including a first color to the power rail connection region, a second color to the active connection region, and a third color to the poly connection region;
  - determining if a first zone-to-zone distance comprises a distance less than a same-mask distance, wherein a first zone-to-zone distance is a distance between a first identified zone for via placement and a second identified zone for via placement; and
  - in response to a determination that the first zone-to-zone distance comprises the distance less than the same-mask distance, assigning a shifted color sequence for one or more sections of the second identified zone for via placement.

20. A non-transitory computer-readable storage device storing instructions that, when executed by a processor, cause the processor to:
- identify prospective zones for via placement of one or more vertical interconnect access pads (via) in a cell, wherein each of the prospective zones correspond to different regions of via connectivity including a power rail connection region, an active connection region, and a poly connection region; and
- assign different colors to each identified prospective zone, wherein a different color is assigned to each of the prospective zones that correspond to the different regions of via connectivity including a first color to the power rail connection region, a second color to the active connection region, and a third color to the poly connection region.

\* \* \* \* \*